(12) United States Patent
Shum et al.

(10) Patent No.: US 7,645,663 B2
(45) Date of Patent: Jan. 12, 2010

(54) METHOD OF PRODUCING NON VOLATILE MEMORY DEVICE

(75) Inventors: Danny Pak-Chum Shum, Poughkeepsie, NY (US); Haoren Zhuang, Hopewell Junction, NY (US); John R. Power, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 11/779,810

(22) Filed: Jul. 18, 2007

(65) Prior Publication Data

US 2009/0023259 A1    Jan. 22, 2009

(51) Int. Cl.
*H01L 21/00*    (2006.01)

(52) U.S. Cl. .................................................... 438/219
(58) Field of Classification Search .................. 438/219
See application file for complete search history.

(56) References Cited

U.S. PATENT DOCUMENTS

| 5,837,594 A | * | 11/1998 | Honma et al. | ............... 438/396 |
| 7,037,845 B2 | | 5/2006 | Brask et al. | |
| 2007/0246752 A1 | * | 10/2007 | Cheng et al. | ................ 257/288 |

* cited by examiner

*Primary Examiner*—Charles D Garber
*Assistant Examiner*—Andre' C Stevenson
(74) *Attorney, Agent, or Firm*—Slater & Matsil, L.L.P.

(57) ABSTRACT

A method of forming a floating gate structure is disclosed, and includes modifying the etch chemistry of a plasma treated reactive ion etch process using an inert atom to physically damage a dielectric region. The damaged dielectric region is subsequently etched using a wet etch process.

31 Claims, 12 Drawing Sheets

METHOD OF PRODUCING NON VOLATILE MEMORY DEVICE

TECHNICAL FIELD

The invention is related to a semiconductor structure and a method of producing the semiconductor structure. In particular embodiments, the invention is directed to the formation of a flash memory device structure with improved performance and a method for fabricating the same.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0." A memory device may be static or dynamic. A dynamic memory device needs to be refreshed to "remember" the data, whereas a static memory device does not need to be refreshed to retain stored data.

One type of static memory device, also referred to in the art as a non-volatile memory (NVM) device, is a floating gate memory device. A floating gate memory device can be either erasable programmable read-only memory (EPROM) or electrically erasable programmable read-only memory (EEPROM). Both these type of floating gate memories rely on a charge stored in the floating gate (or a charge trap layer) by suitable application of a bias to the various terminals of the device. The charge may be stored by a number of mechanisms such as carrier tunneling and/or injection. The charge may be removed either electrically as in EEPROM devices or by an external source such as an ultra violet light. The presence of this charge in the floating gate determines the state of the memory as logical "1" or "0." Flash EEPROM memories are called such due to their fast program and erase times (as in a lightning flash).

The floating gate devices are usually stacked in large arrays to form memory cells such as flash memory cells. Based on the stacking or layout of the floating gate transistors, flash memory may comprise a NOR, NAND, or an AND memory architecture. As an example, most commercial memory cards such as memory sticks comprise NAND flash memory cells. Flash memory is amongst the most popular memories available in the market today. The popularity of flash memory arises partly due to its compatibility with existing CMOS process flows. Flash memory is simply a field effect transistor, except it has a poly-silicon floating gate (or Silicon Nitride charge trap layer) sandwiched between a tunnel oxide and an inter-poly oxide to form a charge storage layer. However, flash memory devices have some disadvantages or bottlenecks that need to be overcome for continued success.

SUMMARY OF THE INVENTION

In one embodiment, the current invention describes a method of fabricating a semiconductor structure by etching an exposed portion of a material stack comprising a conductive material layer over an insulator layer. The conductive material is first etched using a first etch chemistry in a reactive ion etch chamber exposing the insulator. The insulator is physically damaged by plasma treatment using a second etch chemistry in the reactive ion etch chamber. The plasma damaged insulator is subsequently removed using a conventional etch process such as a wet etch process.

The foregoing has outlined rather broadly embodiments of the present invention. Additional embodiments of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope. The invention will be described and explained with additional specificity and detail through the use of the accompanying drawings in which:

FIGS. 1a-1c illustrates the typical memory and CMOS devices formed with the RIE process, wherein

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely improved methods for etching high-k materials used in floating gate devices. Concepts of the invention can also be applied, however, to other electronic devices. Similarly, although the invention is disclosed for a planar MOS device, the invention can also be applied to other devices such as double gate devices and triple gate devices.

Device scaling is essential for continued success of any technology including flash memories. Device scaling enables formation of more devices per area while improving and/or maintaining key electrical metrics such as program, erase, retention, and read times. This translates into improved product performance at lower cost, thus enabling increased consumption. This typically involves scaling device geometries (such as channel length) to enable operation at, for example, lower power, lower voltages, etc.

Unlike CMOS devices, flash devices have another limitation imposed by the retention time of the trapped charge in the floating gate (or charge trap layer). Ideally, a flash memory cell constrains a trapped charge forever. However, in reality, the trapped charge can tunnel back into the semiconductor channel or control gate during the "off" state of the device. This would result in the loss of stored information. Flash devices sold in the market are expected to store information for at least 10 years. Consequently, this imposes a lower limit on the thickness of the tunnel oxide. Hence, the tunnel oxides in flash devices are at least 6 nm thick and typically around 8 nm to 10 nm. A thicker gate stack dielectric requires a higher operating voltage to ensure program and erase operations. A higher operating voltage (especially on the drain or source side) combined with a thicker dielectric reduces gate control of the channel and hence creates excessive short channel effects. Consequently, this prohibits channel length scaling due to an increase in unwanted leakage currents. Further, higher operating voltages require larger select gate transistors, again reducing device density.

One way of overcoming this barrier is by replacing the gate dielectric stack with a higher-k dielectric material. The increase in the dielectric permittivity increases the gate control of the device by improving the capacitive coupling of the control gate on the channel of the device. This enables the use of a lower operating voltage without compromising the retention time of the device, enabling channel length scaling.

Use of a high-k dielectric enables the effective thickness of the gate stack to be decreased without decreasing the physical thickness (hence charge retention) of the gate dielectric. Hence, the decrease in effective thickness of the gate stack enables channel length scaling, while maintaining the retention time of carriers.

The introduction of high-k materials into a semiconductor process flow creates process and integration challenges. One of the challenges associated with the introduction of high-k dielectric materials relates to their removal from unwanted regions of the wafer. For example, the deposited high-k dielectric material may be required to be removed from logic areas, source, drain areas, contact areas, etc. This requires removal of the high-k dielectric material without removing additional material underneath the high-k material layer. To accomplish this, the etchant should preferably have a faster etch rate for the high-k dielectric relative to the underlying material. However, typical etches used in conventional processing are not selective to high-k dielectric materials. For example, wet etch processes may not be able to remove high-k layers as they tend to recrystallize the high-k material during etch. Similarly, conventional reactive ion etch (RIE) processes may not have good control and result in removal of silicon or oxide present underneath the high-k layer. Further, even if such processes exist, they may not be compatible with existing equipment or process flows.

In various aspects, the invention addresses the problem of creating devices with high-k gate dielectrics in modern microelectronic devices. The invention is particularly applied to flash memory devices.

Embodiments of the current invention disclose a method for selectively removing high-k materials using existing equipment. In one embodiment, the present invention teaches a modification of existing RIE plasma treatment to selectively damage high-k materials. As an example, the over etch of the polysilicon RIE process is modified by the introduction of inert gases in the plasma to damage the high-k layer underneath the polysilicon. An etch process (example an isotropic etch) follows the RIE process and selectively removes the now damaged high-k layer.

According to one aspect of the current invention, a deposited high-k layer is etched by a combination of a plasma reactive ion etching (RIE) followed by a wet chemical etch. The plasma RIE treatment is used to physically damage the high-k layer, whereas the wet chemical etch removes the damaged high-k layer.

In one aspect, the present invention provides a method for selectively etching a material stack. The material stack includes an insulator layer sandwiched between a bottom semiconductor substrate and a top conducting material layer. The method according to embodiments of the current invention uses a plasma RIE treatment to damage the insulator. The damaged insulator layer is easier to etch out and selectively removed without removing or damaging the semiconductor substrate. In a particular embodiment, the current invention uses a modified RIE over etch to vertically damage the insulator. The damaged insulator may then be selectively removed by an isotropic process such as wet etch. The wet etch preferentially etches the damaged region resulting in an anisotropic etch profile.

An exemplary transistor device is shown in FIG. 1 and various methods for the formation of transistor devices using these concepts will then be described with respect to the cross-sectional views of FIGS. 2a-2d and FIG. 5a-5d, FIGS. 7a-7b and 8a-8d, and the flow charts of FIGS. 3, 4, 6 and 9.

Figure 1A:
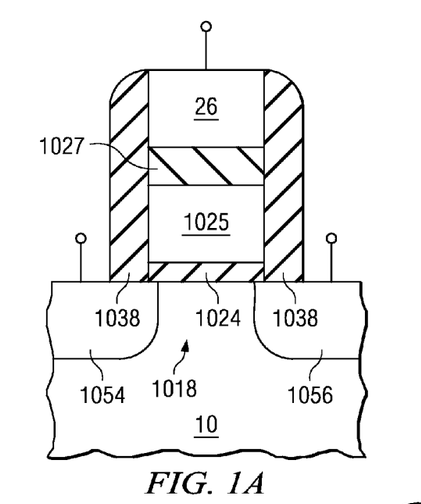
FIG. 1a represents a floating gate flash memory device.
Figure 1B:
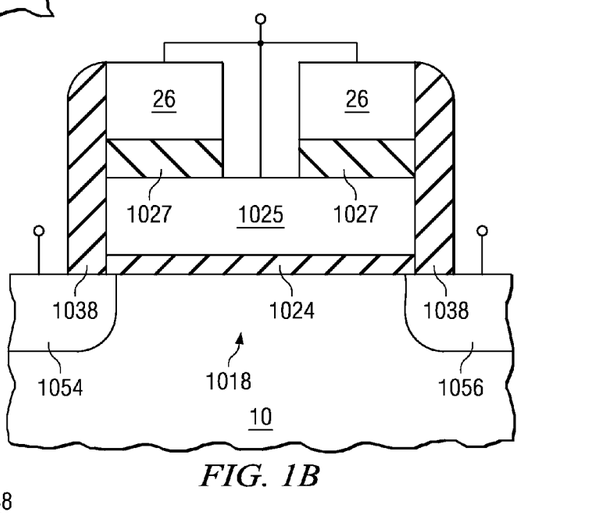
FIG. 1b represents a dual poly shorted select gate transistor.
Figure 1C:
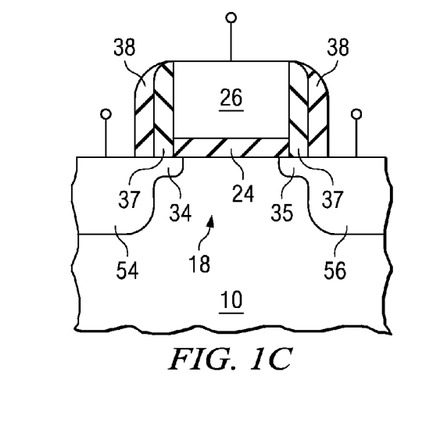
FIG. 1c represents a logic device fabricated simultaneously using one of the embodiments of the present invention.

FIGS. 1a-1c illustrates the typical memory and CMOS devices formed with a preferred embodiment of the current invention, wherein FIG. 1a represents a floating gate flash memory device; FIG. 1b represents a dual poly shorted select gate transistor or a HV logic device with a thicker gate dielectric; and FIG. 1c represents a logic device fabricated simultaneously using one of the embodiments of the present invention.

Referring now to FIG. 1a, a channel 1018, source 1054, and drain 1056 are disposed in a semiconductor body. A gate insulator 1024 is disposed over the channel 1018. A stack of floating gate 1025, inter poly dielectric layer 1027, and control gate 26 are disposed over the gate insulator 1024 forming a floating gate memory device. Spacers 1038 cover the exposed electrodes along the sides and avoids shorting of the gates (26 and 1025).

Referring now to FIG. 1b, a channel 1018, source 1054, and drain 1056 are disposed in a semiconductor body. A gate insulator 1024 is disposed over the channel 1018. A stack of floating gate 1025, inter poly dielectric layer 1027, and control gate 26 are disposed over the gate insulator 1024. The floating gate 1025 and control gate 26 are shorted to form a field effect transistor used in memory cells. Similarly, a high voltage (HV) dual poly shorted transistor can be formed by adding a mask and replacing gate insulator 1024 of FIG. 1a by a thicker gate dielectric 1024. The gate dielectric 1024 of the dual poly shorted field effect transistor may be thicker than the floating gate transistor shown in FIG. 1a and gate dielectric 1024 is preferably about 20 nm to sustain the HV requirement to operate flash memory cells. As the inter poly dielectric 1027 separates the floating gate 1025 and control gate 26, it may also be referred to as inter metal dielectric.

A logic device formed using the current embodiment is shown in FIG. 1c. A channel 18, source 54, drain 56, and source/drain extension 34 and 35 are disposed in a semiconductor body. A gate insulator 24 is disposed over the channel 18. A gate 26 is disposed over the gate insulator 24 forming a logic field effect transistor.

A preferred embodiment process flow will now be discussed for fabricating the floating gate devices. As one advantageous feature, this process flow can be used to simultaneously form both logic and memory devices. The memory regions may either be regions where floating gate memory (FGM) devices are formed or regions that form the high voltage memory (HVM) devices. The HVM devices support the operation of the floating gate memory devices such as select gate transistors. These HVM devices typically comprise shorted dual poly MOS transistors. Logic regions can be either high voltage logic (HVL) or low voltage logic (LVL) devices. High voltage logic devices typically operate at voltages over a certain level (e.g., 3V), whereas low voltage logic devices operate at voltages below that level. For example, input/output transistors that talk to peripheral or outside circuits typically operate at higher operating voltages. Similarly, the logic transistors that constitute the bulk of devices for a given technology are typically low voltage devices. In a typical CMOS flow, all the four device regions FGM, HVM, LVL and HVL are fabricated simultaneously using known masking techniques to selectively expose certain regions of the wafer.

Figure 2A:
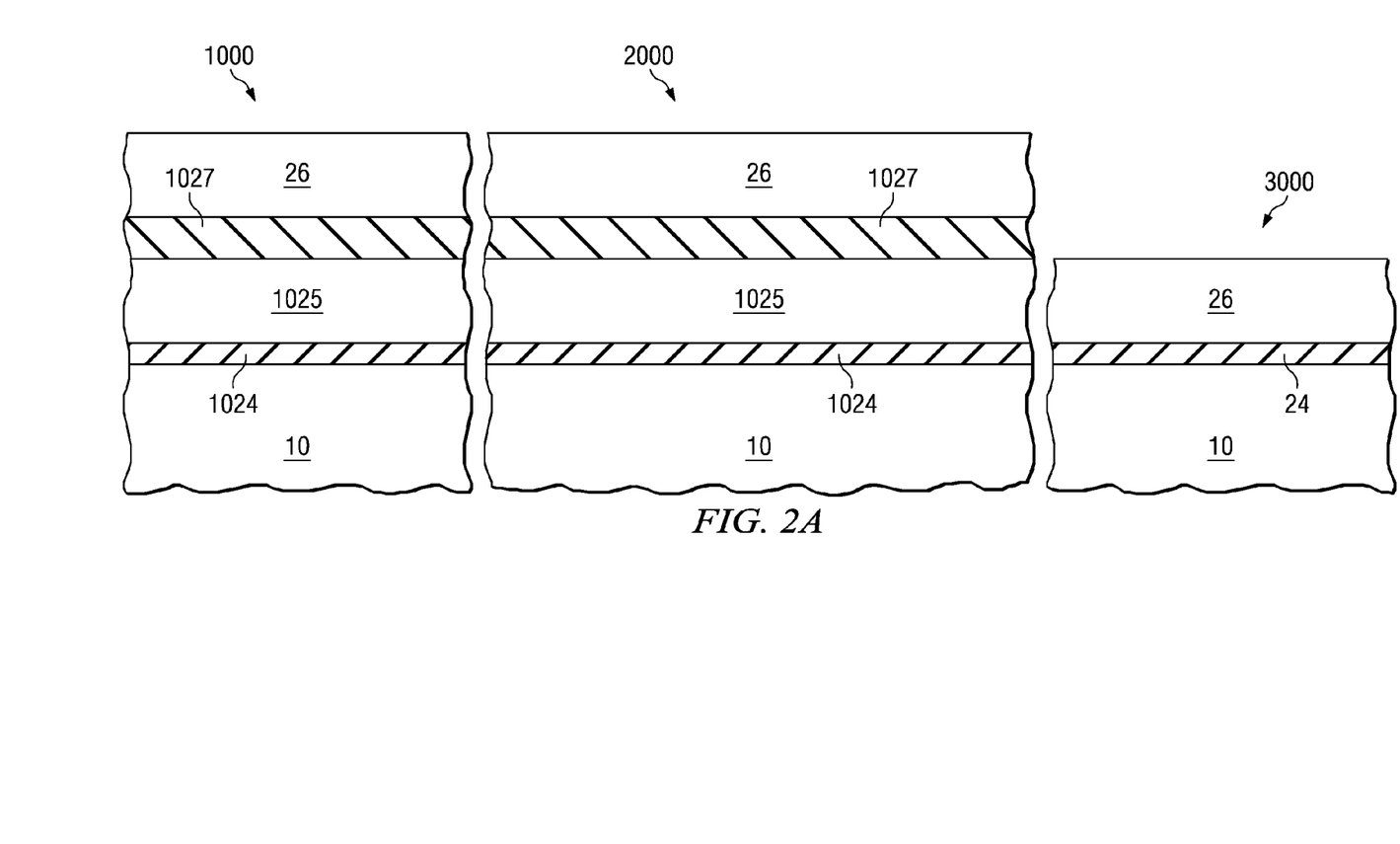
FIGS. 2a-2f show the cross section of a first embodiment process showing formation of floating gate memory, high voltage memory, and logic devices simultaneously.

FIG. 2, which includes FIGS. 2a-2f, illustrates the formation of devices in the FGM 1000, HVM 2000, and LVL 3000 regions of the wafer. Referring first to FIG. 2a, a semiconductor body 10 is provided. In the preferred embodiment, the semiconductor body 10 is a silicon wafer. Some examples of the body 10 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide or others can be used with the wafer.

In the first embodiment, isolation trenches (not shown) are formed in the semiconductor body 10. Isolation trenches can be formed using conventional techniques. The trenches are filled with an isolating material such as an oxide. The trenches define active areas, in which integrated circuit components can be formed. The depth of trench regions may be different for high voltage devices and low voltage devices. For example, the memory and high voltage devices may be built on deep trench isolation, whereas the low voltage devices may be built on shallow trench isolation or they may all be formed on the same trench isolation to reduce process complexities.

As also shown in FIG. 2a, the gate stack is formed over the FGM 1000, HVM 2000, and Logic 3000 regions. Different gate dielectrics can be grown on the semiconductor body by well known masking steps. In the preferred process, the gate dielectric of the HVM transistor 2000 is formed first, followed by the gate dielectric of the floating gate memory FGM device 1000. Preferably the gate dielectric 1024 of the HVM transistor is thicker than the FGM device to support a higher voltage. In the current embodiment, the gate dielectric 1024 of the HVM transistor is an oxide layer about 200 Å. The gate dielectric 1024 of the HVM transistor preferably comprises a thickness of about 150 Å to about 250 Å in one embodiment, although alternatively, the gate dielectric 1024 of the HVM transistor may comprise other dimensions. The gate dielectric 1024 is deposited over exposed portions of the semiconductor body 10. In the current embodiment, the gate dielectric 1024 of the FGM transistor is an oxide layer about 90 Å thick. The gate dielectric 1024 of the FGM transistor preferably comprises a thickness of about 30 Å to about 150 Å in one embodiment, although alternatively, the gate dielectric 1024 of the FGM transistor may comprise other dimensions.

In a different embodiment, the gate dielectric 1024 comprises a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 1024. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 1024 can comprise other high-k insulating materials or other dielectric materials. As implied above, the gate dielectric 1024 may comprise a single layer of material, or alternatively, the gate dielectric 1024 may comprise two or more layers.

The gate dielectric 1024 may be grown by thermal oxidation, or deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 1024 may be deposited using other suitable deposition techniques.

In one illustrated embodiment, the same dielectric layer would be used to form the gate dielectric 1024 for both the p-channel/n-channel transistors of the high voltage memory device and the gate dielectric 1024 of the floating gate memory device. This feature is not however required. In alternate embodiments, the gate dielectric 1024 could be grown selectively in the floating gate memory areas. Similarly, in alternate embodiments, the gate dielectric 1024 could be grown along with either the p-channel transistors or the n-channel transistors.

A first conducting material 1025 is then deposited across the whole semiconductor wafer. This forms the floating gate electrode 1025 over the gate dielectric 1024. The floating gate electrode 1025 preferably comprises a semiconductor material, such as polysilicon or amorphous silicon, although alternatively, other semiconductor materials may be used for the floating gate electrode 1025. In other embodiments, the floating gate electrode 1025 may comprise TiN, TiC, HfN, TaN, TaC, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof, as examples. In one embodiment, the floating gate electrode 1025 comprises a doped polysilicon layer.

The floating gate electrode 1025 may comprise a plurality of stacked gate materials, such as a metal underlayer with a polysilicon cap layer disposed over the metal underlayer. A floating gate electrode 1025 having a thickness between about 400 Å to about 2000 Å may be deposited using CVD, PVD, ALD, or other deposition techniques. In other embodiments, different types of transistors can include gates of different materials and/or thicknesses.

If the floating gate layer comprises polysilicon, it may be doped with a suitable n or p type dopant. For example, an n-type gate electrode may be formed by depositing phosphorus doped floating gate electrode. In some cases, the polysilicon layer may be doped by implanting a suitable dopant. Typically, n-type electrodes may be in-situ doped during deposition by depositing doped polysilicon comprising phosphorus, arsenic, and/or antimony. Similarly, p-type electrodes may be formed by implanting atoms comprising boron and/or $BF_2$. In the preferred embodiment, n-type polysilicon layers are deposited as floating gate layers 1025.

An inter poly dielectric 1027 is then deposited over the floating gate electrode 1025 in both the floating gate memory cell 1000 and high voltage memory 2000 areas. In the preferred embodiment, the inter poly dielectric material is $Al_2O_3$. Other suitable high-k materials include $HfO_2$, $HfSiO_x$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfAlSiO_x$, $HfAlSiO_xN_y$, $ZrSiAlO_x$, $ZrSiAlO_xN_y$, combinations thereof, or combinations thereof with $SiO_2$, as examples. To avoid charge trap levels near the floating gate interface, a thin oxide layer is typically deposited before the high-k deposition. In some embodiments, an additional oxide layer on top of the high-k layer may also be used.

The inter poly dielectric 1027, first conducting material 1025, and gate dielectric 1024 are selectively removed from the logic areas 3000 and a suitable gate dielectric 24 is deposited. After the formation of all needed gate dielectrics for all devices (for example, low voltage logic devices such as core $V_T$, low $V_T$, and high $V_T$ devices etc.), all regions (FGM 1000, HVM 2000, and Logic 3000) of the semiconductor body 10 are opened.

A second conducting material 26 is then deposited across the whole semiconductor wafer. Similar to the first conducting material, the second conducting material may comprise poly silicon or metallic layers. In the preferred embodiment, the second conducting material 26 is an n-type poly silicon layer. Again, this may be implanted with a suitable dopant. An anneal may be introduced to produce a uniform profile in the polysilicon layers and reduce traps and defects in the dielectric materials.

The gate stack layers are next patterned and exposed using known photolithography techniques. The second conducting material 26 is etched to form the control gate electrode on the memory device 1000 using a RIE process, as shown in FIG. 2b.

Reactive ion etching is a combination of physical and chemical etching. The physical nature of the RIE arises due to directional ion bombardment of the wafer surface. The ions are created by high electric fields produced between a top and a bottom electrode. The ions are energized by RF generators connected to these electrodes. The gas chemistry and hence the ionic and chemical nature of RIE is determined by the flow of gases into the RIE furnace.

The RIE process comprises a first break through step followed by a main etch. The RIE process typically ends with an over etch and a clean up. The break through process is typically performed to remove the thin layer of native oxide covering the second conducting material layer 26, which in the current embodiment comprises polysilicon. Since the oxide etch rate of the main etch is usually very low, the etch may be typically modified. This is done by for example increasing the RF power or adding a suitable etchant to the plasma.

Figure 2B:
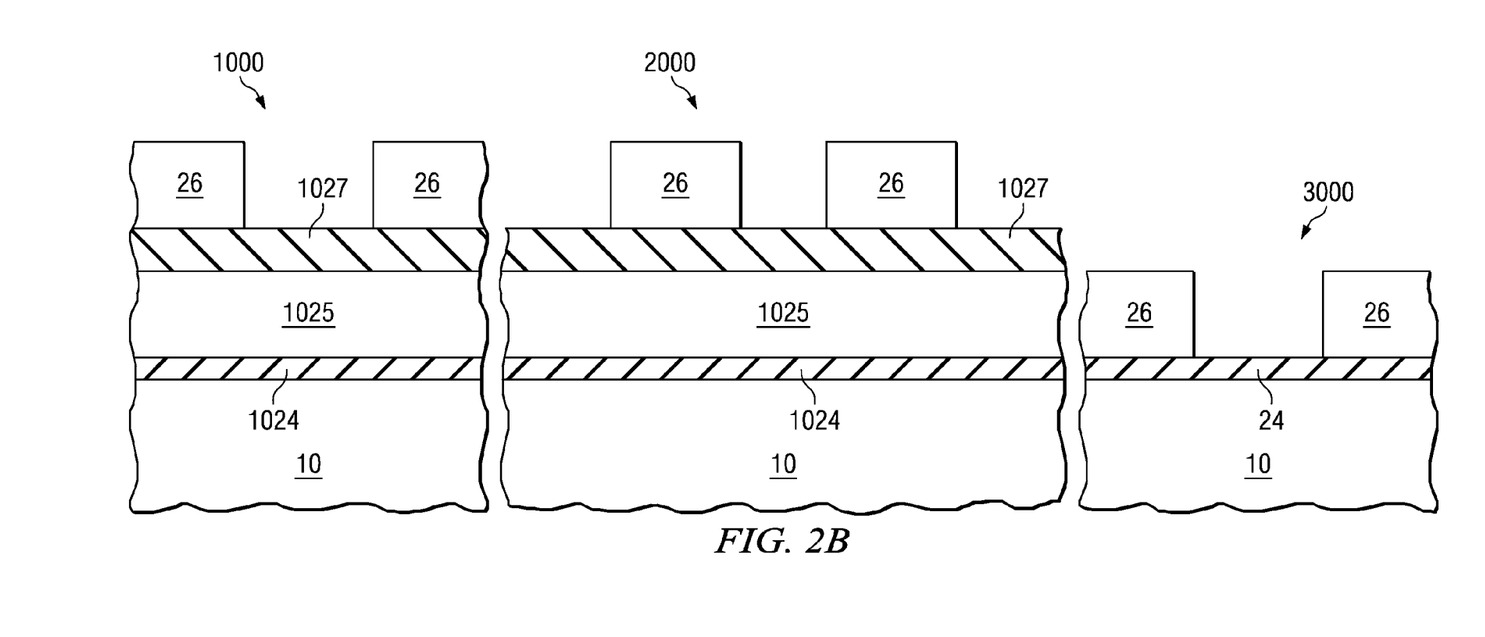

Referring now to FIG. 2b, the main RIE follows the break through step. Chemistries based on bromine are amongst the most popular polysilicon etchants due to their high selectivity over oxides. For example, a typical component of the main etchant gas may be HBr. As an example, the pressure may be about 10 mT to about 60 mT, the main RIE etch may contain HBr at a flow rate of between about 200 sccm and about 600 sccm. The top and bottom electrodes may be at about 600 W and about 100 W. In a preferred embodiment, the RIE process comprises a total pressure of 20 mT, and the HBR flow rate of about 550 sccm.

Figure 2C:
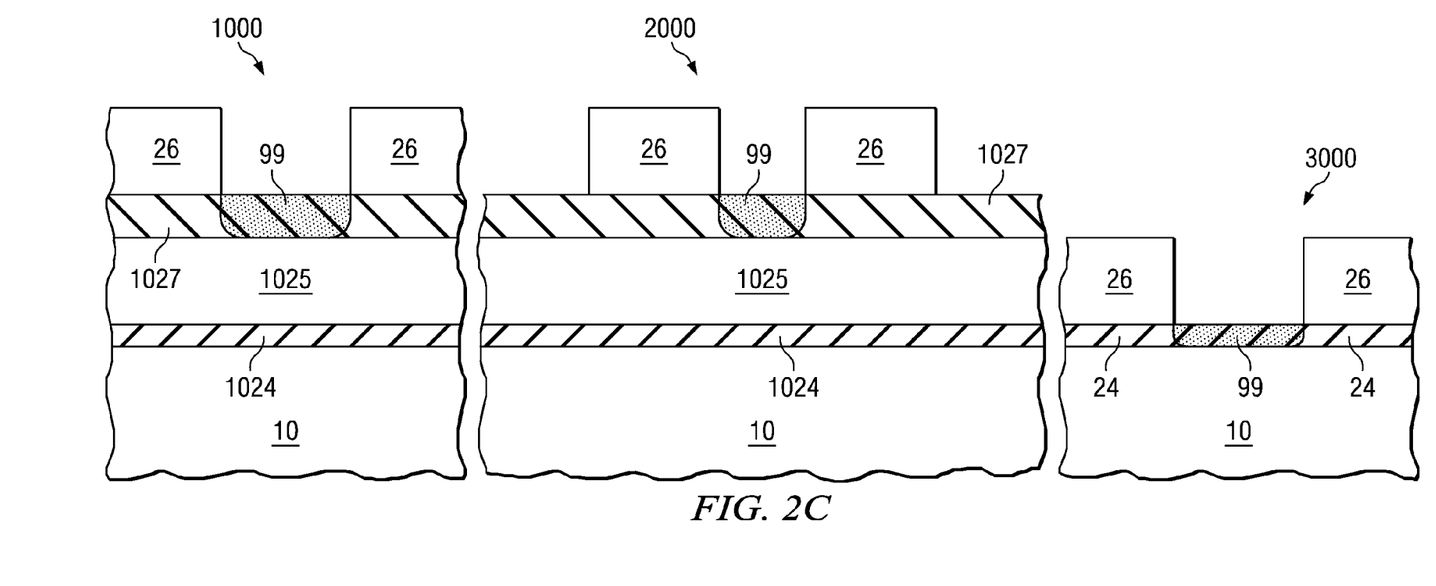

The RIE over etch follows the main etch as shown in FIG. 2c. It is typically done to improve etch uniformity and remove any un-etched polysilicon that may form stringers. In the current embodiment, it also physically damages the high-k layer as shown in region 99. After the main polysilicon etch, the chemistry of the plasma is changed by pumping an inert gas to remove the etchants from the RIE chamber. A different gas is introduced to create a new etch chemistry in the RIE chamber. As an example, the new chemistry comprises HBr, $O_2$, and He. The presence of $O_2$ improves etch selectivity to oxide. The presence of oxygen may also improve etch anisotropy by perhaps forming an oxide based inhibitor layer on the polysilicon sidewalls. In the current embodiment, helium is the damage-producing ion. Ionic helium is accelerated by the electric field arising from the potential difference between the top and bottom electrode. The accelerated ions impinge on the dielectric damaging the dielectric lattice, for example by creating point defects. Consequently, a damaged anisotropic region 99 is formed by the impinging ion.

As an example, using a TEL™ SCCM, the RIE chamber may be at a total pressure of about 30 mT to about 50 mT with the top plate at about 120 W to about 300 W and the bottom plate at about 50 W to about 200 W. The gas flow rate for helium may be about 300 sccm to about 500 sccm, oxygen may be about 2 sccm to about 20 sccm, and HBr may be about 300 sccm to about 600 sccm. In a specific example, this RIE process may be performed at a total gas pressure of about 40 mT, the top electrode at about 135 W, the bottom electrode at about 67 W, helium flow rate of about 440 sccm, HBr flow rate of about 500 sccm, oxygen flow rate of about 9 sccm. This etch can damage a 30 Å high-k layer in about 70 s.

In other embodiments of this process, other reactor parameters may be used. Similarly, in different embodiments other inert gases such as argon, xeon, and neon may be used as the damage-producing ion. In fact, any atom, that is chemically non-reactive with silicon, may be used in some embodiments. Consequently, the temperature of the RIE will also determine the choice of the damage-producing ion. In some embodiments, a chlorine based etchant (such as $BCl_3$ gas) may be used instead of bromine based etchants. However, bromine based etchants are typically more selective to silicon. In some cases, a combination of chlorine and bromine based etchants may be used to improve etch rates.

Figure 2D:
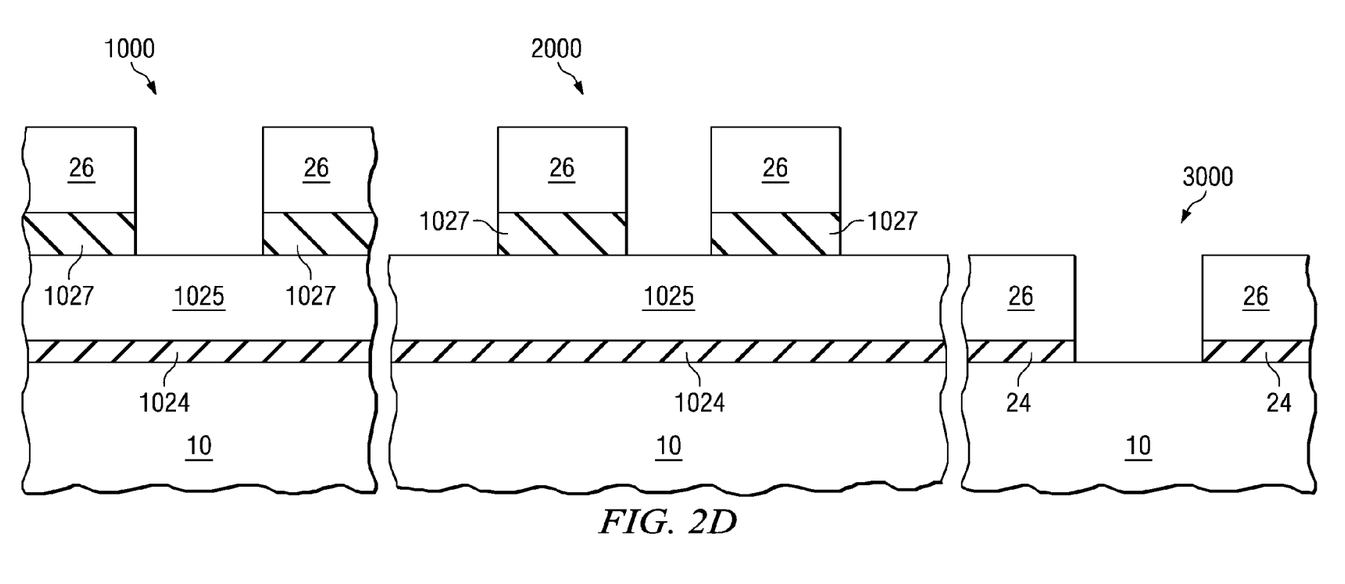

A wet etch follows the RIE over etch that removes the damaged dielectric region 99 as shown in FIG. 2d. For example, the wafer may be exposed to a dilute HF. The HF may be diluted from about 50:1 to about 400:1. In other embodiments, different wet chemistries such as buffered HF, BOE may also be used.

Figure 2E:
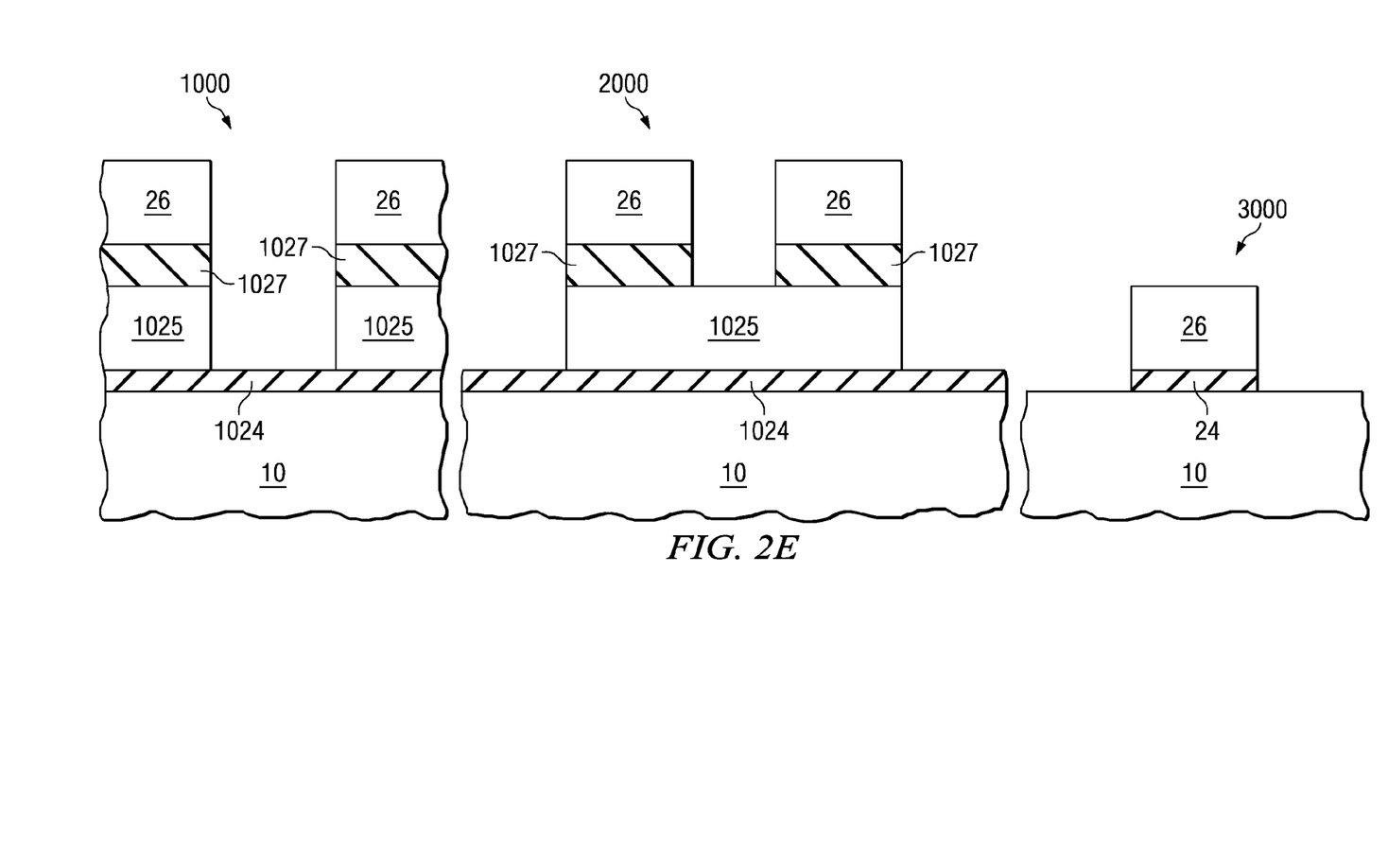

Referring to FIG. 2e, the wafer is then masked and exposed to open the FGM regions 1000 and portions of the high voltage memory regions 2000. A second RIE process follows to remove the first conducting material 1025 from the exposed FGM, HVM 1000, and 2000 regions. This creates the floating gate electrode 1025 of the proper pattern in the FGM and HVM regions. As in the previous case, the second RIE step comprises a break through step, a main etch and an over etch. The over etch step is modified to include inert gases such as helium, argon, xeon, and neon that physically damage the gate dielectric 1024.

The second RIE over etch follows the etching of the floating gate electrode 1025. After the polysilicon etch, the chemistry of the plasma is changed by pumping an inert gas to remove the etchants from the RIE chamber. The chemistry of this over etch may be less intense than the previous over etch as the typical thickness of the gate dielectric 1024 is less than the thickness of the inter poly dielectric 1027. As an example, the new chemistry contains a combination of HBr, $O_2$ and He. In a specific example, using a TEL™ SCCM, the RIE chamber may be at total pressure of 40 mT with the top plate at 135 W and the bottom plate at 67 W. The flow rate of the etchants may comprise helium gas at 440 sccm, oxygen gas at 9 sccm, and HBr gas at 500 sccm. The treatment time may be suitably adjusted for a thinner gate dielectric.

In other embodiments of this process, other reactor parameters may be used. For example, a $BCl_3$ gas (chlorine based etchant) may be used instead of HBr (bromine based etchant). However, HBr is typically more selectivity to silicon than $BCl_3$. In some cases, a combination of $BCl_3$ gas and HBr gas may be used to improve etch rates.

Figure 2F:
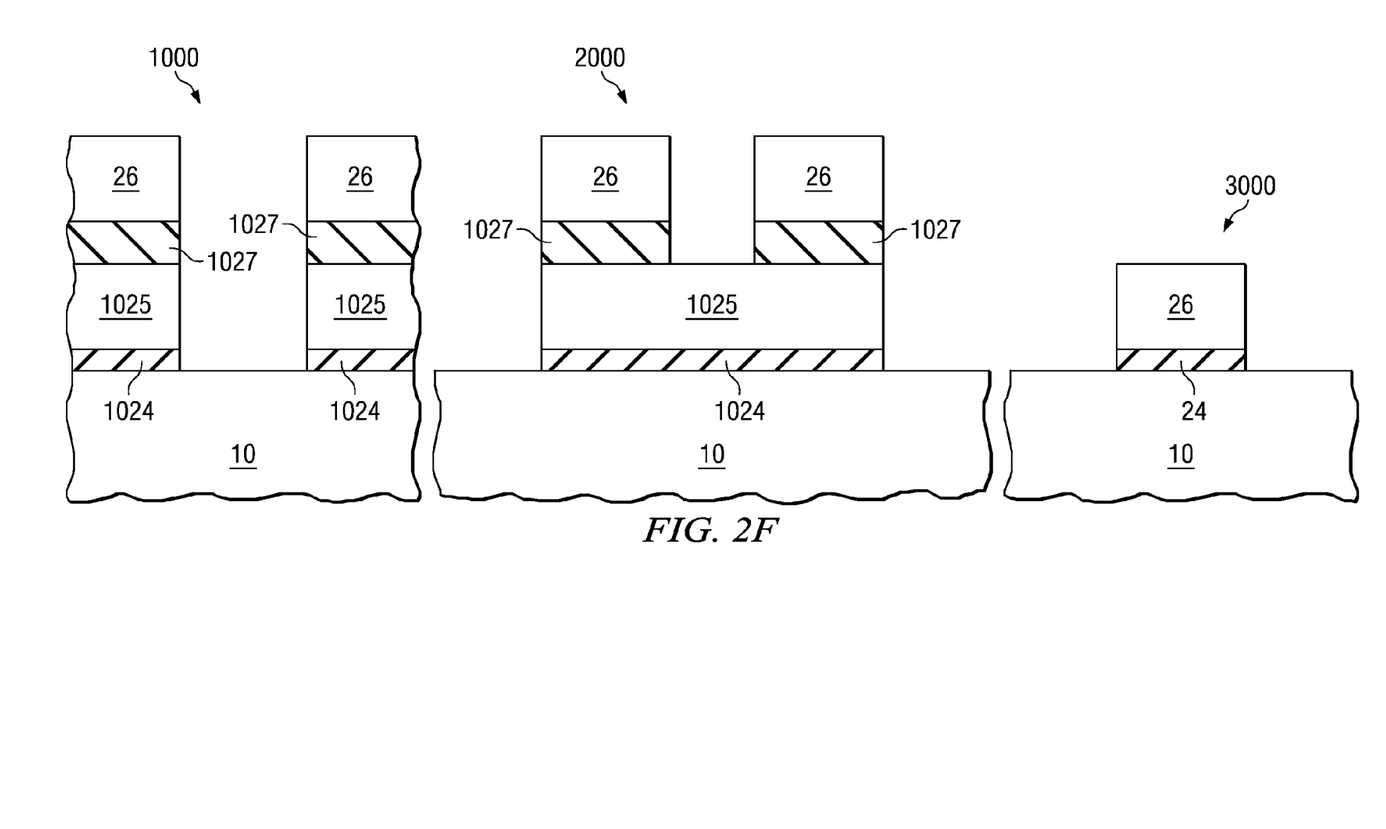

As shown in FIG. 2f, a second wet etch step follows the RIE over etch to remove the gate dielectric 1024. Similar to the first wet etch step, various embodiments of this process are possible.

Further processing continues as in a typical integrated chip manufacturing process. For example, spacers, source, and drain regions are formed followed by metallization. The devices after front end processing are shown in FIG. 1.

Figure 3:
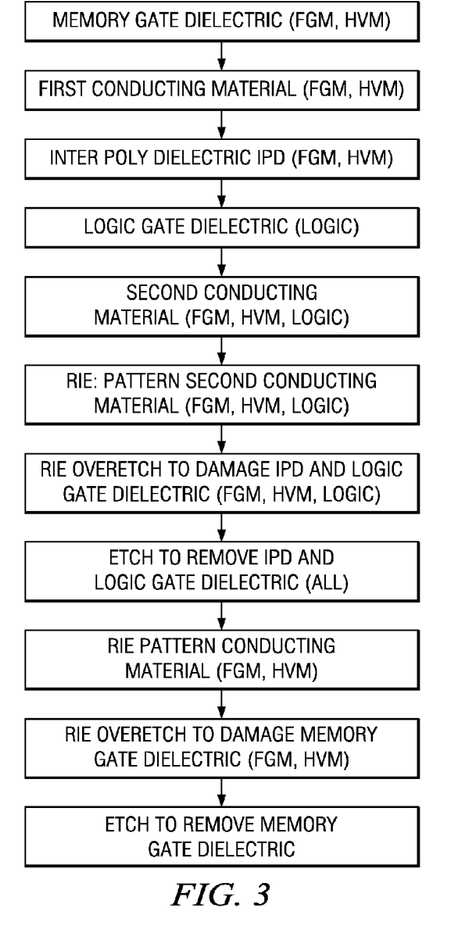
FIG. 3 illustrates a flow diagram of one implementation of the first embodiment process.
Figure 4:
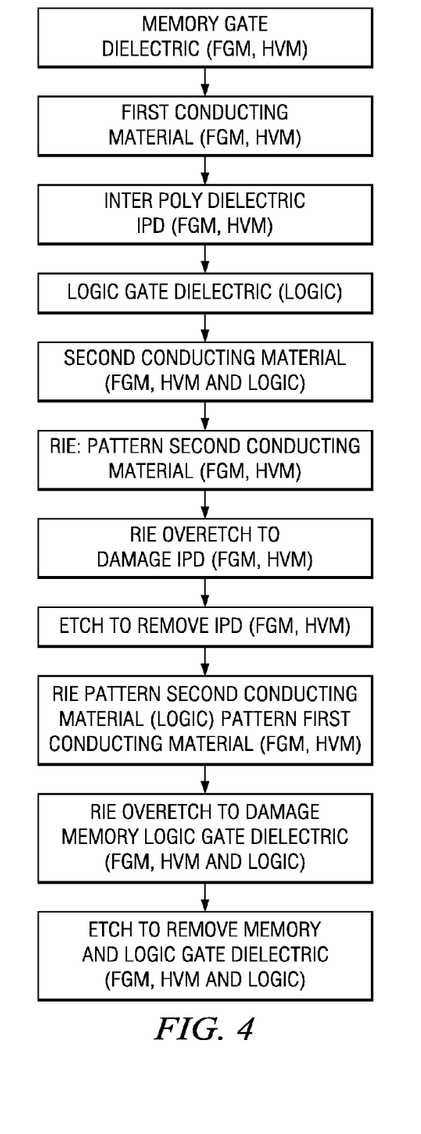
FIG. 4 illustrates a flow diagram of an alternate implementation of the first embodiment process.

In the embodiments described so far using FIGS. 2 and 3, the gate electrode 26 on the logic areas was patterned along with the control gate electrode 26 on the memory device 1000. However, in some embodiments, the gate electrode may be patterned along with the floating gate electrode 1025 of the memory region 1000. Such an alternate embodiment is shown in flow chart FIG. 4.

Figure 5A:
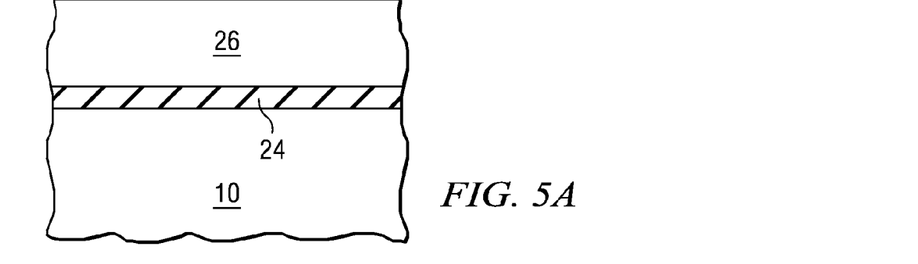
FIGS. 5a-5d show the cross section of a second embodiment process forming a part of a patterned capacitor structure.
Figure 5B:
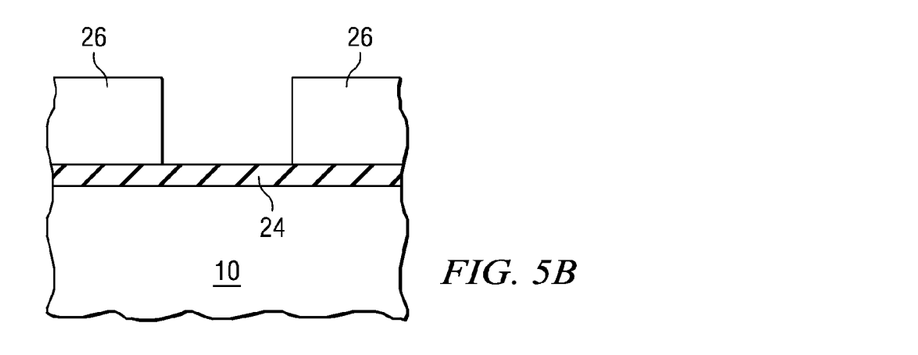
Figure 5C:
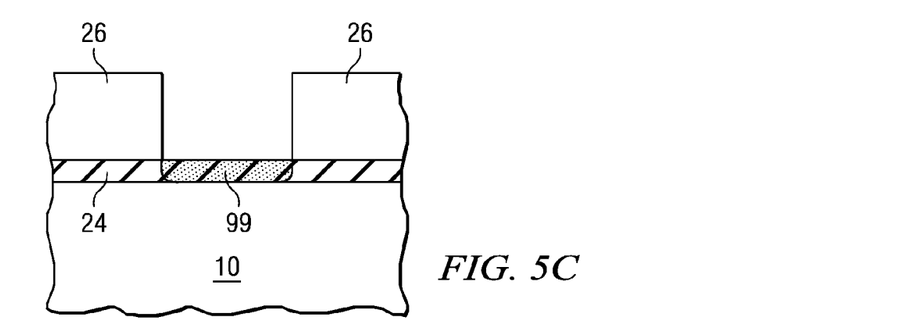
Figure 5D:
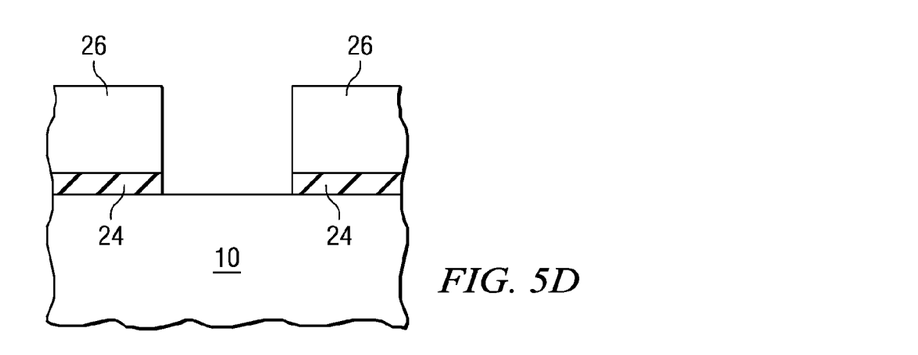
Figure 6:
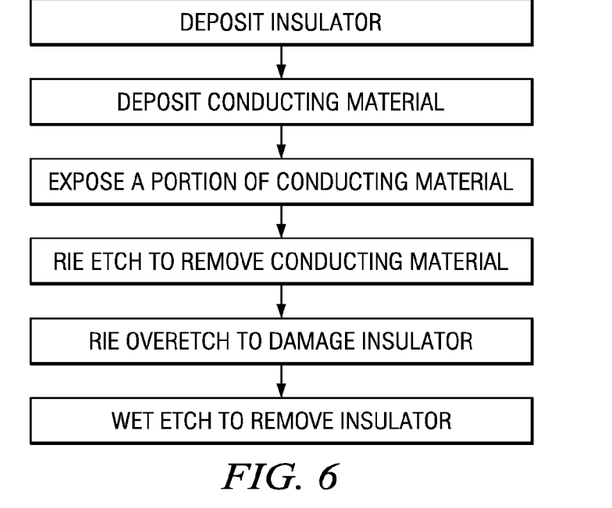
FIG. 6 illustrates a flow diagram of one implementation of the second embodiment process.

A second embodiment will now be described with reference to the cross-sectional diagrams of FIGS. 5a-5d and the flow diagram of FIG. 6. In this embodiment, the invention teaches a method for forming a patterned capacitor comprising a first conducting material, an insulator over the first second conducting material and finally a second conducting material over the insulator. The capacitor may be part of a metal insulator metal capacitor, a metal insulator semiconductor capacitor, a semiconductor insulator semiconductor capacitor, or a field effect transistor.

According to an aspect of the current invention, (referring to FIG. 5a) a first conductive material 10 forms the bottom electrode of the capacitor. The first conducting material 10 may either be a metal, silicon or a poly silicon material. An insulator 24 is deposited on the first conducting material 10. The insulator is a high-k dielectric material such as $Al_2O_3$. A second conducting material 26 is deposited on the insulator 24. The structure is patterned by conventional lithography steps to open areas for etch.

A three step RIE process comprising of a break through, main etch, and a timed over etch is used to form the patterned capacitor structure. After the break through step to remove any oxide layer, the main RIE etch anisotropically etches the conducting material 26 to form part of the top electrode as shown in FIG. 5b. The RIE etch chemistry of the over etch is modified to include an inert gas such as helium. This damages the insulator layer 24 forming a damaged region 99. This layer is etched off during subsequent steps during as an example, a wet etch.

Figure 7A:
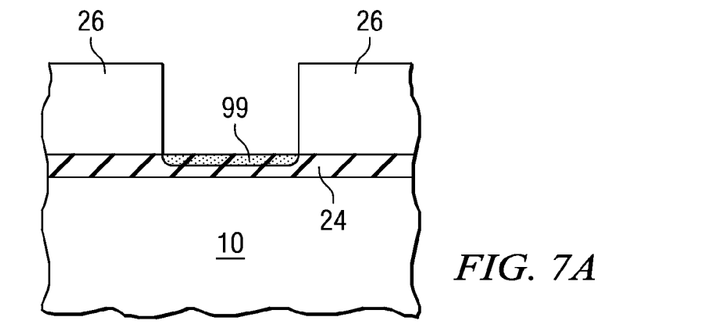
FIG. 7a-7b show the cross section of a third embodiment process forming a part of a patterned capacitor structure.
Figure 7B:
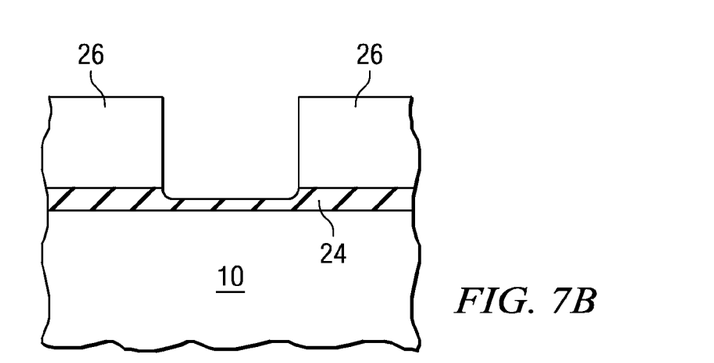

In a third embodiment, the process continues as described above forming a structure shown in FIG. 5b. Referring now to FIG. 7a, the over etch is modified to damage only a part of the dielectric 24. This may be achieved, for example, by changing the power, flow rate of gases, or time of the etch process. Subsequent etch steps remove only a part of the dielectric 24 leaving a layer over the bottom electrode 10 as shown in FIG. 7b. This may be useful for a number of reasons. For example, a thin layer of dielectric may help protect the surface of the bottom electrode from trenching during subsequent cleans and etches.

Figure 8A:
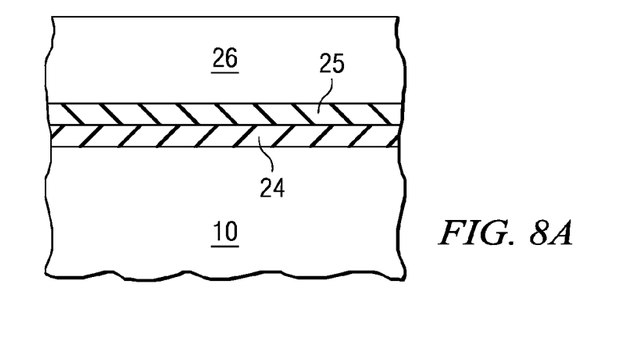
FIGS. 8a-8d show the cross section of a fourth embodiment process forming a part of a gate stack of a field effect transistor.
Figure 8B:
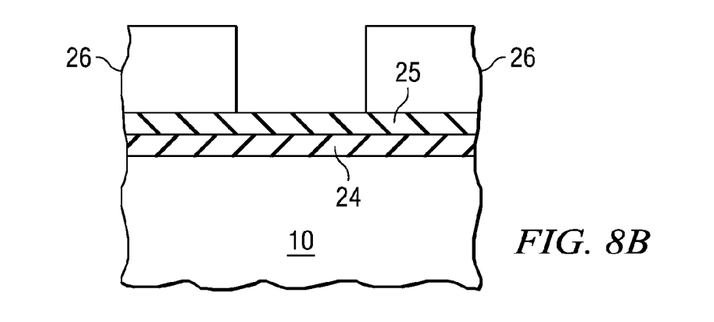
Figure 8C:
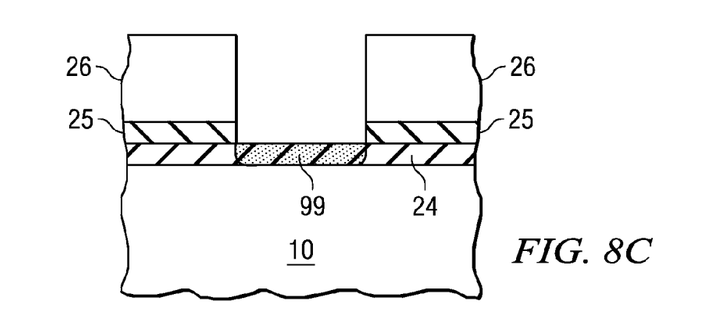
Figure 8D:
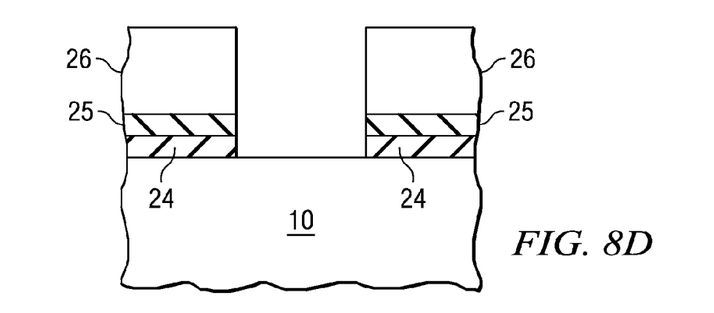
Figure 9:
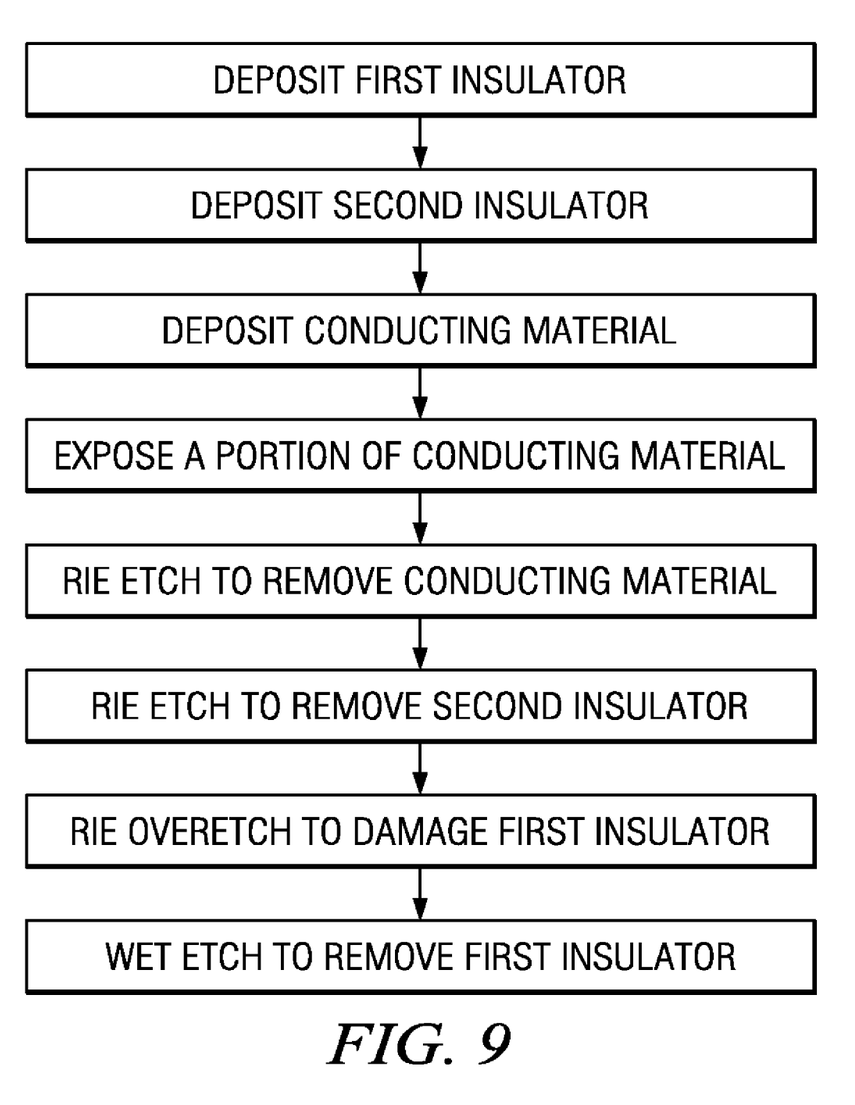
FIG. 9 illustrates a flow diagram of one implementation of the fourth embodiment process.

Another alternate embodiment of the current invention comprises a method for selectively patterning a gate stack for a field effect transistor or metal insulator semiconductor capacitor comprising a conducting material 26 and insulator (24 and 25), whereby the insulator contains a first material layer 24 and a second material layer 25 (FIG. 8a). The embodiment of this invention is shown in FIGS. 8a-8d along with the flow chart of FIG. 9. After the conducting material 26 is removed by the RIE (FIG. 8b), the RIE continues with perhaps a second etch chemistry to remove the second insulator layer 25. A third etch chemistry follows to damage the first insulator 24. A subsequent wet etch removes the damaged first insulator 24 (shown in FIG. 8d).

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of fabricating a semiconductor structure, the method comprising:
   depositing an insulator over a semiconductor body;
   depositing a first conducting material over the insulator;
   depositing a dielectric material over the first conducting material;
   depositing a second conducting material over the dielectric material;
   using a lithography step to expose a portion of the second conducting material;
   etching the exposed portion of the second conducting material to expose a portion of the dielectric material, wherein the etching is performed in a reactive ion etch chamber using a first gas chemistry;
   intentionally physically damaging the exposed portion of the dielectric material, wherein the damage is performed in the reactive ion etch chamber using a second gas chemistry; and
   etching the damaged dielectric material to expose a portion of the first conducting material.

2. The semiconductor method as claimed in claim 1, wherein the semiconductor body comprises a semiconductor substrate.

3. The semiconductor method as claimed in claim 1, wherein the first conducting material comprises polysilicon.

4. The semiconductor method as claimed in claim 1, wherein the second conducting material comprises polysilicon.

5. The semiconductor method as claimed in claim 1, wherein depositing the dielectric material comprises depositing an oxide layer followed by depositing a high-k material layer.

6. The semiconductor method as claimed in claim 5, wherein the high-k material layer comprises $Al_2O_3$.

7. The semiconductor method as claimed in claim 1, wherein the first gas chemistry comprises HBr.

8. The semiconductor method as claimed in claim 1, wherein the second gas chemistry comprises an inert element.

9. The semiconductor method as claimed in claim 8, wherein the second gas chemistry comprises oxygen, helium and HBr.

10. The semiconductor method as claimed in claim 1, wherein the etching the damaged dielectric material is performed using a wet etch.

11. The semiconductor method as claimed in claim 10, wherein the wet etch comprises dilute HF.

12. The semiconductor method as claimed in claim 1, further comprising:
   etching the exposed portion of the first conducting material to expose a portion of the insulator, wherein the etching is performed in the reactive ion etch chamber using a third gas chemistry;
   physically damaging the exposed portion of the insulator, wherein the damage is performed in the reactive ion etch chamber using a fourth gas chemistry; and
   etching the damaged insulator to expose a portion of the semiconductor body.

13. The semiconductor method as claimed in claim 12, wherein the third gas chemistry comprises HBr.

14. The semiconductor method as claimed in claim 12, wherein the fourth gas chemistry comprises oxygen, helium and HBr.

15. A method of fabricating a semiconductor structure, the method comprising:
   depositing an insulator over a semiconductor body;
   depositing a conducting material over the insulator;
   using a lithography step to expose a portion of the conducting material;
   etching the exposed portion of the conducting material to expose a portion of the insulator, wherein the etching is performed in a reactive ion etch chamber using a first gas chemistry;
   intentionally physically damaging the exposed portion of the insulator, wherein the damage is performed in the reactive ion etch chamber using a second gas chemistry; and
   etching the damaged insulator.

16. The method as claimed in claim 15, wherein etching the damaged insulator exposes a portion of the conducting material.

17. The method as claimed in claim 15, wherein the conducting material comprises polysilicon.

18. The method as claimed in claim 15, wherein depositing the insulator comprises depositing an oxide layer followed by deposition of a high-k material layer.

19. The method as claimed in claim 15, wherein the insulator comprises at least one material selected from the group consisting of $Al_2O_3$, $HfO_2$, $HfSiO_x$, $HfAlO_x$, $HfAlSiO_x$, nitrides thereof and combinations thereof.

20. The method as claimed in claim 15, wherein the second gas chemistry comprises materials selected from the group consisting of helium, argon, neon, xeon and combinations thereof.

21. A method for fabricating a semiconductor body comprising memory areas and logic areas, the memory areas comprising floating gate transistors and select gate transistors, the logic areas comprising field effect transistors, the method comprising:
   separating the semiconductor body into memory and logic areas, the memory areas further comprising of select gate and floating gate areas;
   depositing a first gate dielectric over the memory areas;
   depositing a first conducting material over the first gate dielectric;
   depositing an inter poly dielectric material over the first conducting material;
   depositing a second gate dielectric over the logic areas;
   depositing a second conducting material over the logic and memory areas;
   using a lithography step to expose a portion of the second conducting material over the logic and memory areas;
   etching the exposed portion of the second conducting material to expose a portion of the inter poly dielectric material on the memory areas and the second gate dielectric on the logic areas, wherein the etching is performed in a reactive ion etch chamber using a first gas chemistry;
   physically damaging the exposed portion of the inter poly dielectric material, wherein the damage is performed in the reactive ion etch chamber using a second gas chemistry;
   etching the damaged inter poly dielectric material to expose a portion of the first conducting material;
   etching the second gate dielectric to expose a portion of the semiconductor body in the logic regions;
   etching the exposed portion of the first conducting material to expose a portion of the first gate dielectric, wherein the etching is performed in the reactive ion etch chamber using a third gas chemistry; and
   etching the first gate dielectric to expose a portion of the semiconductor body in the memory regions.

22. The method as claimed in claim 21, wherein the first conducting material comprises polysilicon.

23. The method as claimed in claim 21, wherein the second conducting material comprises polysilicon.

24. The method as claimed in claim 21, wherein depositing the inter poly dielectric material comprises depositing an oxide layer followed by deposition of a high-k material layer.

25. The method as claimed in claim 24, wherein the high-k material layer comprises $Al_2O_3$.

26. The method as claimed in claim 21, wherein the first gate dielectric comprises at least one material selected from the group consisting of $Al_2O_3$, $HfO_2$, $HfSiO_x$, nitrides thereof and combinations thereof.

27. The method as claimed in claim 21, wherein the second gate dielectric comprises at least one material selected from the group consisting of $Al_2O_3$, $HfO_2$, $HfSiO_x$, $HfAlO_x$, $HfAlSiO_x$, nitrides thereof and combinations thereof.

28. The method as claimed in claim 21, wherein the second gas chemistry comprises at least one material selected from the group consisting of helium, argon, neon, xeon, and combinations thereof.

29. The method as claimed in claim 21, wherein etching the first gate dielectric further comprises:
   physically damaging the exposed portion of the first gate dielectric, wherein the damage is performed in the reactive ion etch chamber using a fourth gas chemistry; and
   etching the damaged first gate dielectric to expose a portion of the semiconductor body.

30. The method as claimed in claim 29, wherein etching the second gate dielectric further comprises:
   physically damaging the exposed portion of the second gate dielectric, wherein the damage is performed in the reactive ion etch chamber using a fifth gas chemistry; and
   etching the damaged second gate dielectric to expose a portion of the semiconductor body in the logic areas.

31. The method as claimed in claim 21, wherein etching the second gate dielectric further comprises:

physically damaging the exposed portion of the second gate dielectric, wherein the damage is performed in the reactive ion etch chamber using a fourth gas chemistry; and etching the damaged second gate dielectric to expose a portion of the semiconductor body in the logic areas.

* * * * *